US012127360B2

(12) United States Patent
Cheng et al.

(10) Patent No.: US 12,127,360 B2
(45) Date of Patent: Oct. 22, 2024

(54) ELECTRONIC DEVICE

(71) Applicant: VIVO MOBILE COMMUNICATION CO., LTD., Dongguan (CN)

(72) Inventors: Dongcun Cheng, Dongguan (CN); Zhengjun Luo, Dongguan (CN)

(73) Assignee: VIVO MOBILE COMMUNICATION CO., LTD., Dongguan (CN)

( * ) Notice: Subject to any disclaimer, the term of this patent is extended or adjusted under 35 U.S.C. 154(b) by 248 days.

(21) Appl. No.: 17/845,985

(22) Filed: Jun. 21, 2022

(65) Prior Publication Data
US 2022/0322551 A1  Oct. 6, 2022

Related U.S. Application Data

(63) Continuation of application No. PCT/CN2020/139200, filed on Dec. 25, 2020.

(30) Foreign Application Priority Data

Dec. 26, 2019 (CN) .......................... 201911366946.9

(51) Int. Cl.
*E05D 3/06* (2006.01)
*E05D 3/18* (2006.01)
(Continued)

(52) U.S. Cl.
CPC ......... *H05K 5/0217* (2013.01); *H05K 5/0017* (2013.01)

(58) Field of Classification Search
CPC .. H05K 5/0017; H05K 5/0217; H05K 5/0226; E05D 3/06; E05D 3/18;
(Continued)

(56) References Cited

U.S. PATENT DOCUMENTS 9,179,559 B1 * 11/2015 Kim ...................... G06F 1/1641
9,204,565 B1 * 12/2015 Lee ....................... E05F 1/1016
(Continued)

FOREIGN PATENT DOCUMENTS

CN        107690010 A      2/2018
CN        208044999 U     11/2018
(Continued)

OTHER PUBLICATIONS

Examination Report issued in related Korean Application No. 10-2022-7018255, mailed May 18, 2023, 8 pages.
(Continued)

*Primary Examiner* — Xiaoliang Chen
(74) *Attorney, Agent, or Firm* — IPX PLLC

(57) ABSTRACT

An electronic device is provided. The electronic device includes a device body, a rotary plate, a slide plate, and a flexible display screen. The rotary plate is hinged to the device body through a rotary shaft. The rotary plate is provided with a first guide portion. The slide plate is slidably connected to the rotary plate. The slide plate is provided with a second guide portion. The second guide portion is slidably matched with the first guide portion. The flexible display screen is connected to the device body and the slide plate respectively. The slide plate slides relative to the rotary plate during switching between an unfolded state and a folded state of the flexible display screen.

8 Claims, 4 Drawing Sheets

(51) Int. Cl.
*H05K 5/00* (2006.01)
*H05K 5/02* (2006.01)

(58) Field of Classification Search
CPC ......... E05D 3/20; G06F 1/203; G06F 1/1601; G06F 1/1616; G06F 1/1624; G06F 1/1632; G06F 1/1641; G06F 1/1652; G06F 1/1681; G09F 9/301
USPC ................. 361/749, 679.01, 679.06, 679.12; 455/566
See application file for complete search history.

(56) References Cited

U.S. PATENT DOCUMENTS

| | | | | |
|---|---|---|---|---|
| 9,348,450 | B1* | 5/2016 | Kim | H04M 1/0268 |
| 9,964,995 | B1* | 5/2018 | Morrison | H01Q 21/30 |
| 10,444,797 | B2* | 10/2019 | Kee | H04M 1/0268 |
| 10,509,441 | B2* | 12/2019 | Wu | H04M 1/0268 |
| 10,520,992 | B1* | 12/2019 | Chang | H05K 5/0226 |
| 10,564,682 | B1* | 2/2020 | Wu | H05K 5/0226 |
| 10,659,576 | B1* | 5/2020 | Hsu | G06F 1/1624 |
| 10,747,269 | B1* | 8/2020 | Choi | H04M 1/0237 |
| 10,761,574 | B1* | 9/2020 | Hsu | G06F 1/1626 |
| 11,374,194 | B2* | 6/2022 | Feng | G06F 1/1624 |
| 2011/0063783 | A1* | 3/2011 | Shim | G06F 1/1615 361/679.01 |
| 2014/0111954 | A1* | 4/2014 | Lee | H04M 1/0268 361/749 |
| 2015/0261259 | A1* | 9/2015 | Endo | H10K 59/12 361/679.06 |
| 2015/0378397 | A1* | 12/2015 | Park | G06F 1/1656 361/679.27 |
| 2016/0165024 | A1* | 6/2016 | Tan | H04M 1/0268 455/566 |
| 2017/0006725 | A1* | 1/2017 | Ahn | G06F 1/1681 |
| 2017/0038798 | A1* | 2/2017 | Lee | G06F 1/1641 |
| 2018/0011515 | A1* | 1/2018 | Yoo | G06F 1/1681 |
| 2018/0210495 | A1* | 7/2018 | Lin | H04M 1/0216 |
| 2018/0210496 | A1* | 7/2018 | Lin | H04M 1/0214 |
| 2018/0210497 | A1* | 7/2018 | Lin | E05D 3/06 |
| 2018/0210510 | A1* | 7/2018 | Lin | H04M 1/0268 |
| 2018/0210511 | A1* | 7/2018 | Lin | E05D 3/06 |
| 2018/0210512 | A1* | 7/2018 | Lin | E05F 5/08 |
| 2018/0210513 | A1* | 7/2018 | Lin | G06F 1/1641 |
| 2018/0270971 | A1* | 9/2018 | Moon | H05K 5/0017 |
| 2018/0309861 | A1* | 10/2018 | Lin | H04M 1/021 |
| 2018/0347245 | A1* | 12/2018 | Chu | G06F 1/1681 |
| 2019/0012028 | A1* | 1/2019 | Park | G06F 1/1641 |
| 2019/0025887 | A1* | 1/2019 | Seo | G06F 1/1652 |
| 2019/0027703 | A1* | 1/2019 | Ahn | H10K 59/87 |
| 2019/0104626 | A1* | 4/2019 | Jeon | H05K 5/0226 |
| 2019/0200470 | A1* | 6/2019 | Woo | G06F 1/1681 |
| 2019/0339742 | A1* | 11/2019 | Jia | G06F 1/1681 |
| 2019/0380218 | A1* | 12/2019 | Moon | H05K 5/0226 |
| 2019/0391618 | A1* | 12/2019 | Hsu | G06F 1/1616 |
| 2020/0012318 | A1* | 1/2020 | Delaporte | G06F 1/1677 |
| 2020/0081486 | A1* | 3/2020 | Lin | H04M 1/022 |
| 2020/0081487 | A1* | 3/2020 | Lin | H04M 1/0268 |
| 2020/0081494 | A1* | 3/2020 | Lin | G06F 1/166 |
| 2020/0081495 | A1* | 3/2020 | Lin | G06F 1/1681 |
| 2020/0081502 | A1* | 3/2020 | Lin | H04M 1/022 |
| 2020/0084305 | A1* | 3/2020 | Lin | H04M 1/0268 |
| 2020/0103935 | A1* | 4/2020 | Hsu | G06F 1/1681 |
| 2020/0117233 | A1* | 4/2020 | Ou | G06F 1/1652 |
| 2020/0117245 | A1* | 4/2020 | Ou | G06F 1/1616 |
| 2020/0133341 | A1* | 4/2020 | Ou | G06F 1/1616 |
| 2020/0225711 | A1* | 7/2020 | Pelissier | G06F 1/1624 |
| 2020/0257335 | A1* | 8/2020 | Kim | G06F 1/1641 |
| 2020/0310497 | A1* | 10/2020 | Hsu | E05D 3/18 |
| 2020/0320906 | A1* | 10/2020 | Knarr | G06F 1/1626 |
| 2020/0326751 | A1* | 10/2020 | Kim | G06F 1/1616 |
| 2020/0341522 | A1* | 10/2020 | Kim | G09F 9/301 |
| 2020/0355216 | A1* | 11/2020 | Bae | G06F 1/1652 |
| 2020/0401193 | A1* | 12/2020 | Hsu | F16M 11/22 |
| 2021/0014989 | A1* | 1/2021 | Hsu | H04M 1/0268 |
| 2021/0341972 | A1* | 11/2021 | Togashi | G06F 1/1652 |
| 2021/0359277 | A1* | 11/2021 | Jung | H10K 50/8426 |
| 2021/0366318 | A1* | 11/2021 | Feng | G09F 9/301 |
| 2021/0383727 | A1* | 12/2021 | Han | G06F 1/1656 |
| 2022/0124188 | A1* | 4/2022 | Song | G06F 1/1652 |
| 2022/0253103 | A1* | 8/2022 | Choi | G09F 9/301 |
| 2022/0254281 | A1* | 8/2022 | Zhang | G06F 1/1601 |
| 2022/0263930 | A1* | 8/2022 | Koh | H04M 1/0216 |
| 2022/0322553 | A1* | 10/2022 | Zhang | H05K 5/0017 |
| 2022/0353358 | A1* | 11/2022 | Lee | H04M 1/0264 |

FOREIGN PATENT DOCUMENTS

| | | |
|---|---|---|
| CN | 208401905 U | 1/2019 |
| CN | 109495621 A | 3/2019 |
| CN | 109587302 A | 4/2019 |
| CN | 109922181 A | 6/2019 |
| CN | 110022386 A | 7/2019 |
| CN | 110033707 A | 7/2019 |
| CN | 110259816 A | 9/2019 |
| CN | 110491289 A | 11/2019 |
| CN | 111010829 A | 4/2020 |
| JP | 2004135056 A | 4/2004 |

OTHER PUBLICATIONS

International Search Report issued in corresponding International Application No. PCT/CN2020/139200, mailed Mar. 24, 2021, 5 pages.
First Office Action issued in related Chinese Application No. 201911366946.9, mailed Aug. 4, 2020, 7 pages.
Extended European Search Report issued in related European Application No. 20906564.8, mailed Dec. 2, 2022, 9 pages.

* cited by examiner

ELECTRONIC DEVICE

CROSS-REFERENCE TO RELATED APPLICATIONS

This application is a continuation of International Application No. PCT/CN2020/139200, filed on Dec. 25, 2020, which claims priority to Chinese Patent Application No. 201911366946.9 filed on Dec. 26, 2019. The entire contents of each of the above-referenced applications are expressly incorporated herein by reference.

TECHNICAL FIELD

The present disclosure relates to the field of communications technologies, and in particular to an electronic device.

BACKGROUND

As the electronic device industry develops, people expect a screen size of an electronic device to be as large as possible, but a large screen leads to a large electronic device, so that it is not easy to carry the electronic device. Therefore, a contradiction between a large screen demand and portability is generated.

To resolve the contradiction, a screen may be set as a flexible display screen, which can be folded. When the flexible display screen is in an unfolded state, a relatively large display area can be obtained to meet a user's demand for a large screen. When the flexible display screen is in a folded state, the entire flexible display screen is relatively small, so that the electronic device can be carried easily.

The flexible display screen may be folded around a rotary shaft. To prevent a fold from occurring on the flexible display screen, a size of the rotary shaft is usually designed to be relatively large, which leads to great thickness of the entire electronic device.

SUMMARY

The present disclosure discloses an electronic device.

To resolve the foregoing problem, the following technical solutions are used in the present disclosure.

An electronic device is provided, including:
a device body;
a rotary plate, where the rotary plate is hinged to the device body through a rotary shaft and is provided with a first guide portion;
a slide plate, where the slide plate is slidably connected to the rotary plate and is provided with a second guide portion, where the second guide portion is slidably matched with the first guide portion; and
a flexible display screen, where the flexible display screen is connected to the device body and the slide plate respectively, and the slide plate slides relative to the rotary plate during switching between an unfolded state and a folded state of the flexible display screen.

BRIEF DESCRIPTION OF DRAWINGS

The accompanying drawings described herein are used to provide further understanding of the present disclosure and constitute a part of the present disclosure. The illustrative embodiments of the present disclosure and descriptions thereof are used to explain the present disclosure, and do not constitute any improper limitation on the present disclosure. In the accompanying drawings.

REFERENCE SIGNS

100—Device body, 110—Body portion, 120—Bracket, 200—Rotary plate, 210—First guide portion, 211—First positioning flange, 212—First comb tooth, 212a—First bar—shaped portion, 212b—Second bar—shaped portion, 212c—Extension flange, 213—Second comb tooth, 220—Second positioning flange, 300—Rotary shaft, 400—Slide plate, 410—Second guide portion, 411—Step portion, 420—Main body portion, 430—Spacing bar, 440—Positioning groove, 500—Flexible display screen, 600—Lens, 700—Cover plate, 800—Button.

DETAILED DESCRIPTION

To make the objectives, technical solutions, and advantages of the present disclosure clearer, the following clearly describes the technical solutions of the present disclosure with reference to the specific embodiments of the present disclosure and the corresponding accompanying drawings. Apparently, the described embodiments are merely a part rather than all of the embodiments of the present disclosure. All other embodiments obtained by a person of ordinary skill in the art based on the embodiments of the present disclosure without creative efforts shall fall within the protection scope of the present disclosure.

The technical solutions disclosed by various embodiments of the present disclosure are described in detail below with reference to the accompanying drawings.

Figure 1:
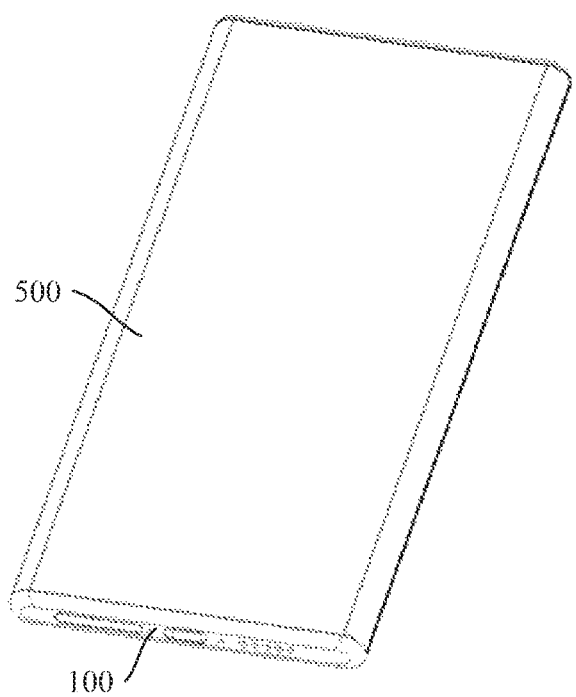
FIG. 1 is a schematic diagram of an electronic device, when a flexible display screen thereof is in a folded state, according to an embodiment of the present disclosure.
Figure 2:
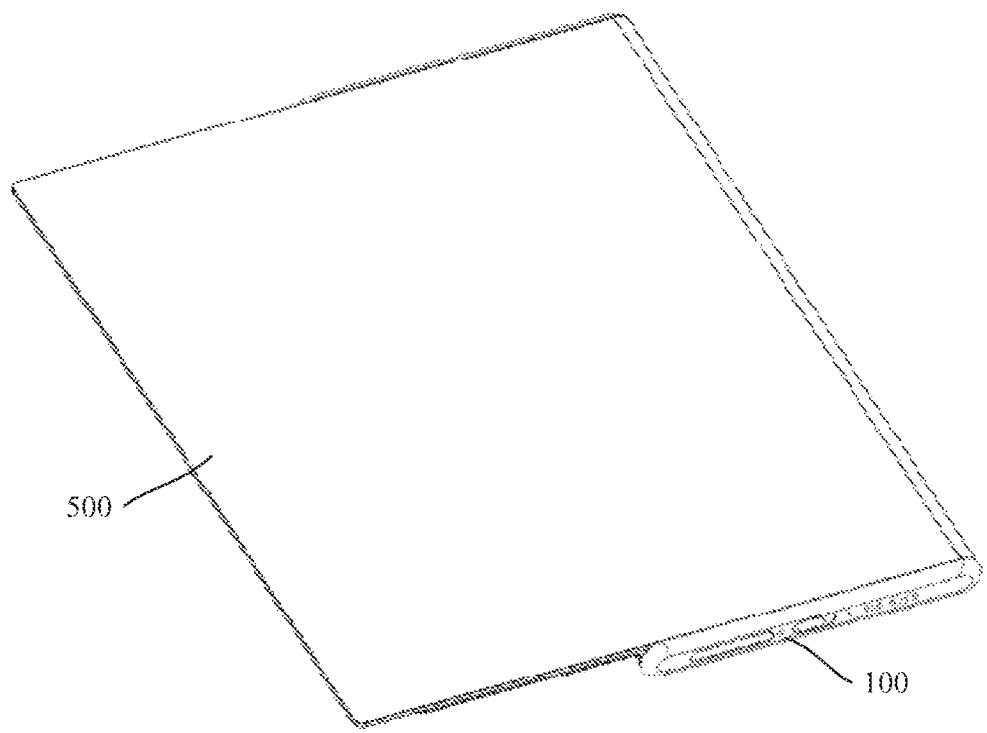
FIG. 2 is a schematic diagram of the electronic device, when the flexible display screen thereof is in an unfolded state, according to an embodiment of the present disclosure.
Figure 3:
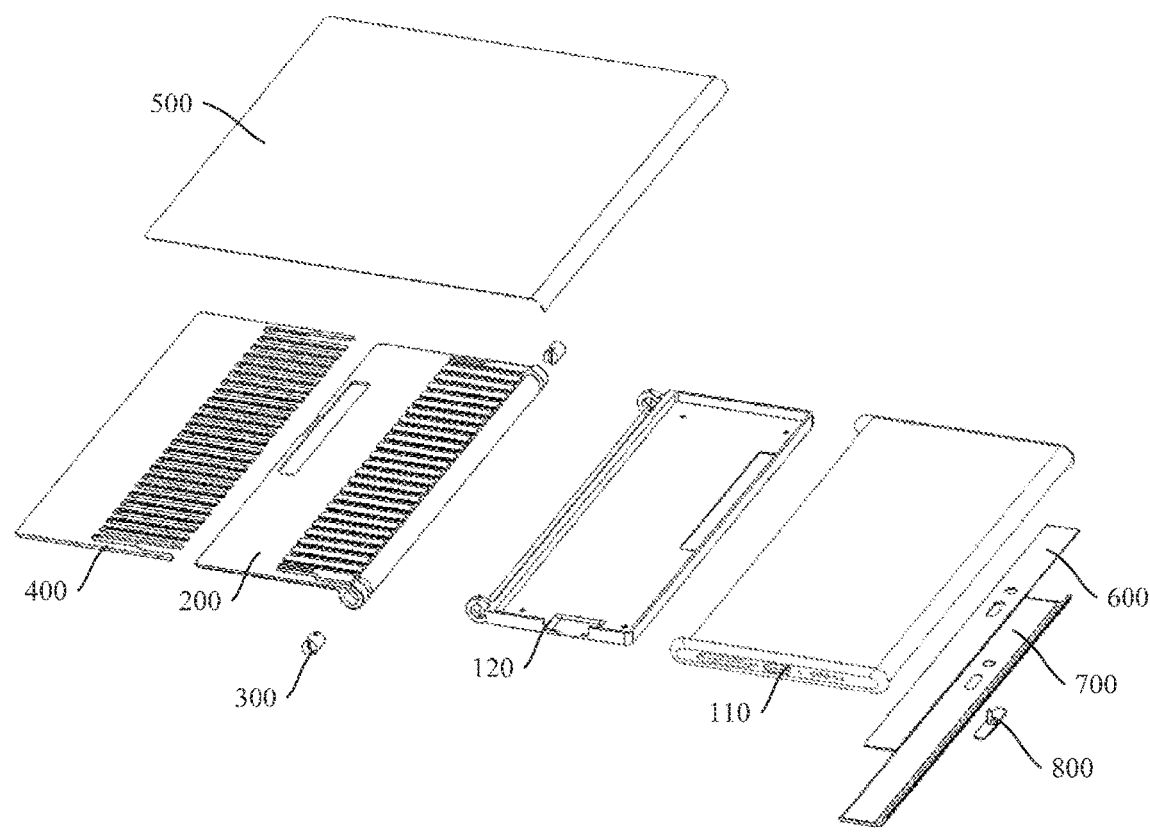
FIG. 3 is an exploded view of the electronic device according to an embodiment of the present disclosure.
Figure 4:
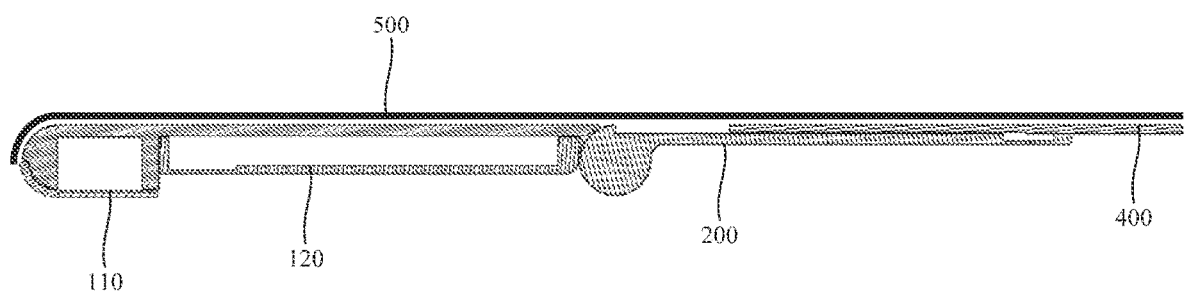
FIGS. 4-6 are sectional views of the electronic device in different states according to embodiments of the present disclosure.
Figure 5:
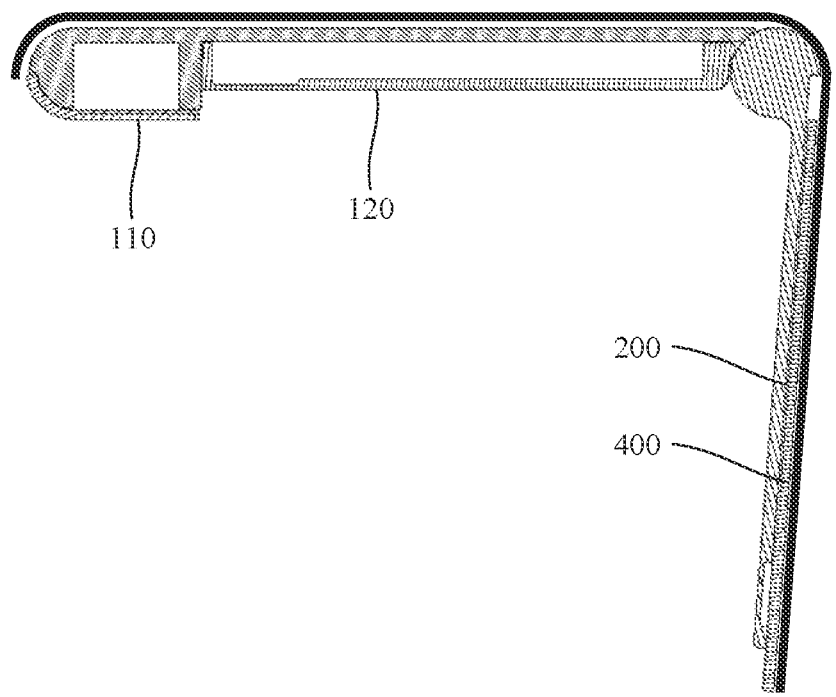
Figure 6:
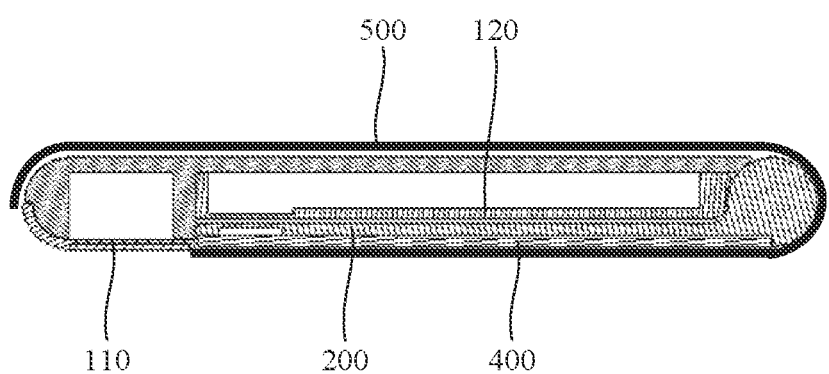
Figure 7:
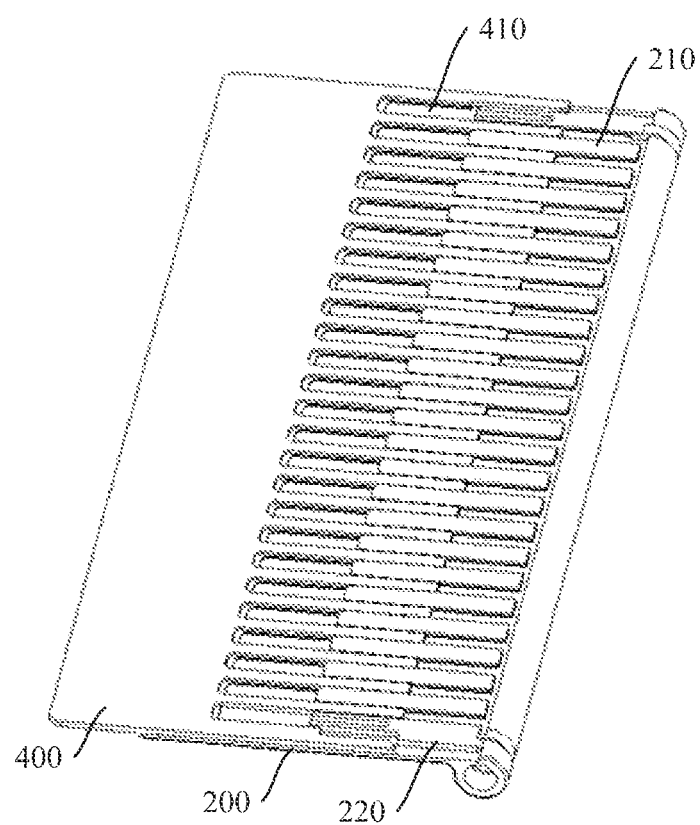
FIG. 7 is a schematic diagram of matching between a rotary plate and a slide plate in the electronic device according to an embodiment of the present disclosure.
Figure 8:
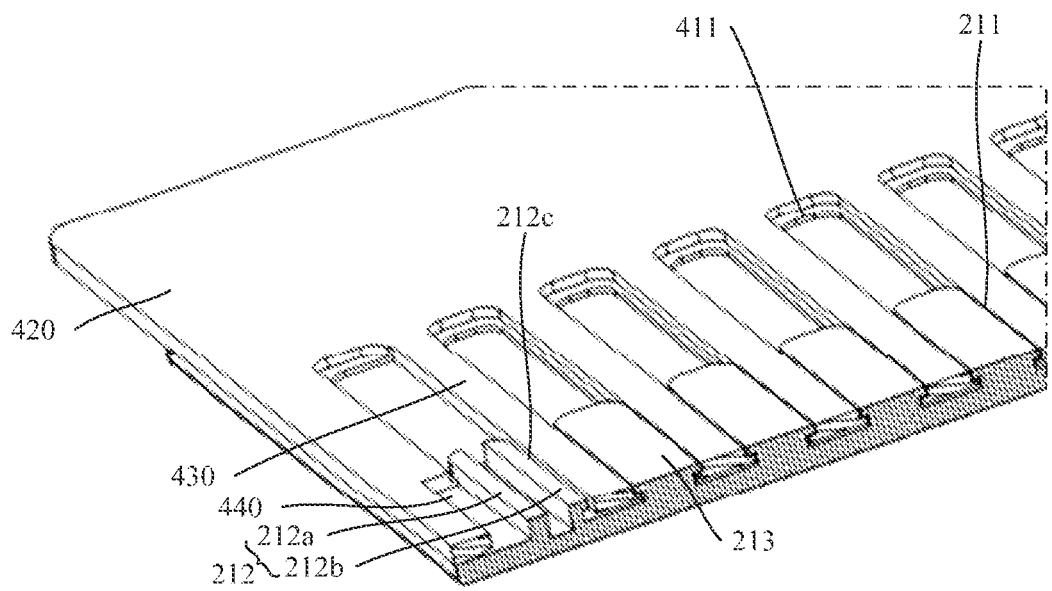
FIG. 8 is a partial sectional view of FIG. 7.

As shown in FIG. 1 to FIG. 8, embodiments of the present disclosure disclose an electronic device. The electronic device includes a device body 100, a rotary plate 200, a rotary shaft 300, a slide plate 400, and a flexible display screen 500.

The device body 100 may be used as a main structure of the electronic device. The device body 100 may specifically include a body portion 110 and a bracket 120. The body portion 110 may be used as a basic member of the device body 100. Functional devices such as a circuit board, a battery, and a camera may be disposed in the body portion 110. The bracket 120 may be connected to the body portion 110.

The rotary plate 200 may be hinged to the device body 100 through the rotary shaft 300. Therefore, the rotary plate 200 may be rotated relative to the device body 100, and the rotary plate 200 is provided with a first guide portion 210. In some embodiments, when the device body 100 includes the body portion 110 and the bracket 120, the rotary plate 200 may be hinged to the bracket 120 through the rotary shaft 300. The rotary shaft 300 may be a damping pin, and there may be two damping pins. The two damping pins may be connected to both sides of the rotary plate 200. The damping pin can not only achieve hinging between the rotary plate 200 and the device body 100, but also produce a damping effect, so that relative rotation between the rotary plate 200 and the device body 100 can be more stable.

The slide plate 400 is slidably connected to the rotary plate 200. The slide plate 400 is provided with a second guide portion 410. The second guide portion 410 is slidably matched with the first guide portion 210. Both the slide plate 400 and the rotary plate 200 may be flat plates, which may be parallel to each other and may be stacked together when they slide relative to each other. When the slide plate 400 and the rotary plate 200 slide relative to each other, the first guide portion 210 is slidably matched with the second guide portion 410, so as to provide guidance for relative sliding between the slide plate 400 and the rotary plate 200. In some embodiments, the first guide portion 210 may be disposed at both ends of the rotary plate 200, the second guide portion 410 may be disposed at both ends of the slide plate 400. One of the first guide portion 210 and the second guide portion 410 may be disposed as a protrusion, and the other may be disposed as a groove.

The flexible display screen 500 has an unfolded state and a folded state. When the flexible display screen 500 is in the unfolded state, the flexible display screen 500 is unfolded, so that a relatively large screen size can be obtained and a better display effect can be achieved. When the flexible display screen 500 is in the folded state, the flexible display screen 500 may be folded as a U-shaped structure, so that a size of the electronic device can be reduced, which helps to carry the electronic device easily. The flexible display screen 500 is connected to the device body 100 and the slide plate 400 respectively. When a state of the flexible display screen 500 is changed, the flexible display screen 500 can drive the slide plate 400 to slide relative to the rotary plate 200, and then the rotary plate 200 rotates relative to the device body 100. In some embodiments, one end of the flexible display screen 500 may be fixedly connected to the device body 100 by bonding, and the other end may be fixedly connected to the slide plate 400 by bonding.

In addition, the electronic device may further include a lens 600, a cover plate 700, and a button 800. Both the lens 600 and the cover plate 700 may be used as decorative pieces, the cover plate 700 can cover the lens 600, and the button 800 may be disposed on the cover plate 700. The flexible display screen 500 may be locked by an operation on the button 800, so that the flexible display screen 500 keeps in the folded state. The flexible display screen 500 can be also unlocked, so that the flexible display screen 500 can be switched to the unfolded state.

In this embodiment of the present disclosure, during switch between the unfolded state and the folded state of the flexible display screen 500, the rotary plate 200 rotates relative to the device body 100, and the slide plate 400 slides relative to the rotary plate 200, thereby supporting the flexible display screen 500 and preventing the flexible display screen 500 from being stretched. Because both the rotary plate 200 and the slide plate 400 are plate-shaped structures, they can be set to be relatively thin, so that thickness of the electronic device can be reduced. In addition, the flexible display screen 500 may always be attached to the device body 100 and the slide plate 400, so that no crack easily occurs on an appearance surface of the electronic device, thereby improving appearance texture of the electronic device.

In an alternative embodiment, the first guide portion 210 may include multiple comb teeth, and the second guide portion 410 may include multiple comb teeth grooves. The multiple comb teeth are matched with the multiple comb teeth grooves in a one-to-one correspondence. The comb teeth and comb teeth grooves are all bar-shaped structures, and their sizes are relatively small. Therefore, in a case that sizes of the rotary plate 200 and the slide plate 400 are fixed, more comb teeth and comb teeth grooves may be set, which leads to more positions for matching the rotary plate 200 with the slide plate 400, so that relative sliding between the rotary plate 200 and the slide plate 400 can be more stable. In some embodiments, the multiple comb teeth may be parallel to each other, and the multiple comb teeth grooves may be parallel to each other.

When a comb tooth is matched with a comb tooth groove, at least a part of the comb tooth is located in the comb tooth groove. To keep the comb tooth and the comb tooth groove in a matched state, a connecting structure may be disposed at other positions of the rotary plate 200 and the slide plate 400, so that the rotary plate 200 and the slide plate 400 always keep connected. In another embodiment, the comb tooth is provided with a first positioning flange 211, and the comb tooth groove is provided with a step portion 411. The first positioning flange 211 and the step portion 411 are matched in a positioning manner in a direction perpendicular to the slide plate 400 (that is, a direction for stacking the slide plate 400 and the rotary plate 200). In some embodiments, the step portion 411 may be disposed on a side, close to the rotary plate 200, of the comb tooth groove. The first positioning flange 211 may be disposing on a side, away from the rotary plate 200, of the comb tooth. The step portion 411 can support the first positioning flange 211. After such disposing, the comb tooth and the comb tooth groove can not only be slidably matched, but also be matched in a positioning manner in a direction perpendicular to the slide plate 400, so that the slide plate 400 and the rotary plate 200 can maintain a stable connection relationship, and there is no need to set a connection structure at other positions of the slide plate 400 and the rotary plate 200. It can be seen that this solution can simplify a structure of the electronic device.

The multiple comb teeth include a first comb tooth 212. The first comb tooth 212 is an elastic comb tooth. One surface, facing the flexible display screen 500, of the first comb tooth 212 is provided with a first bar-shaped portion 212a and a second bar-shaped portion 212b. Both the first bar-shaped portion 212a and the second bar-shaped portion 212b extend along a sliding direction of the slide plate 400. A gap exists between the first bar-shaped portion 212a and the second bar-shaped portion 212b. With this structure, a distance between the first bar-shaped portion 212a and the second bar-shaped portion 212b may be changed. When the first comb tooth 212 is matched with a comb teeth groove, the first comb tooth 212 is subject to an acting force, so that the first bar-shaped portion 212a and the second bar-shaped portion 212b are squeezed and deformed. At this time, the first bar-shaped portion 212a and the second bar-shaped portion 212b may apply a counter acting force to the slide plate 400. Therefore, both of the first bar-shaped portion and the second bar-shaped portion are closely matched with a side wall of the comb tooth groove, thus producing a damping effect. With the damping effect, sliding between the rotary plate 200 and the slide plate 400 is relatively slow and stable, so that an effect of relative sliding between the rotary plate 200 and the slide plate 400 can be improved. In addition, as service time of the electronic device is increasingly prolonged, even if a comb tooth and a comb tooth groove are worn, the first comb tooth 212 can still make the comb tooth be closely matched with the comb tooth groove, so that use experience of the electronic device can be improved.

In some embodiments, the first bar-shaped portion 212a and the second bar-shaped portion 212b may be only disposed at an end of the first comb tooth 212, so that a moderate damping effect is generated between the first comb tooth 212 and a comb tooth groove.

Further, one end side that is of at least one of the first bar-shaped portion 212a and the second bar-shaped portion 212b and that faces the flexible display screen 500 is provided with an extension flange 212c. The extension flange 212c protrudes toward a surface of a side wall of the comb tooth groove relative to the first bar-shaped part 212a or protrudes toward a surface of the side wall of the comb tooth groove relative the second bar-shaped part 212b. The extension flange 212c may be matched with the side wall of the comb tooth groove. After the extension flange 212c is disposed, when the first comb tooth 212 is matched with a comb tooth groove, the first comb tooth 212 is subject to an acting force, and the side wall of the comb tooth groove can press the extension flange 212c, causing the first bar-shaped portion 212a or the second bar-shaped portion 212b to deform greatly, so that a great damping effect can be formed between the first comb tooth 212 and the comb tooth groove. Therefore, better stability can be provided when the rotary plate 200 and the slide plate 400 slide relative to each other.

Specifically, the multiple comb teeth can all be set as first comb teeth. In this case, a damping effect will be generated between each comb tooth and each comb tooth groove. However, such structure easily leads to an excessively great damping effect between the rotary plate 200 and the slide plate 400, which results in unsmooth relative sliding between the rotary plate and the slide plate. To resolve this problem, the multiple comb teeth may further include a second comb tooth 213. And a surface, facing the flexible display screen 500, of the second comb tooth 213 is a smooth surface. The first comb tooth 212 and the second comb tooth 213 are respectively matched with different comb teeth grooves. That is to say, a surface, facing the flexible display screen 500, of the second comb tooth 213 is not provided with a concave structure, and the surface may be a plane or a curved surface with a small curvature, so that the second comb tooth 213 is basically inelastic, so that relative sliding between the second comb tooth 213 and a comb tooth groove is smoother. In this solution, a damping effect may be generated between the first comb tooth 212 and the comb tooth groove, while the second comb tooth 213 and another comb tooth groove can smoothly slide relative to each other, so that relative sliding between the rotary plate 200 and the slide plate 400 is more stable and smooth.

In an alternative embodiment, a comb tooth groove may be a rectangular groove, and correspondingly, a comb tooth may also have a rectangular structure. When the comb tooth slides relative to the comb tooth groove, a gap between the comb tooth and the comb tooth groove is basically unchanged. In another alternative embodiment, at least one comb tooth groove is a trapezoidal groove, and a cross-sectional area of the trapezoidal groove gradually increases in a direction toward the rotary shaft 300, where the cross section is perpendicular to a sliding direction of the slide plate 400. That is to say, as the flexible display screen 500 is constantly switched to the folded state, a gap between a comb tooth matched with the trapezoidal groove and the trapezoidal groove is constantly reduced, thus generating a damping effect, so that the relative sliding between the rotary plate 200 and the slide plate 400 is more stable, the rotary plate 200 and the slide plate 400 can be prevented from sliding too fast and thus causing a collision, thereby protecting the electronic device and reducing noise generated when the electronic device is folded.

Further, the multiple comb teeth grooves may include a first comb tooth groove and a second comb tooth groove. The first comb tooth groove and the second comb tooth groove are alternately arranged. In a direction toward the rotary shaft 300, a cross-sectional area of the first comb tooth groove gradually increases and a cross-sectional area of the second comb tooth groove gradually decreases. That is to say, the first comb tooth groove and the second comb tooth groove are both trapezoidal grooves, and variation trends of cross-sectional areas of the first comb tooth groove and the second comb tooth groove are opposite in a same direction. When the slide plate 400 slides relative to the rotary plate 200 in a direction close to the rotary shaft 300, a damping effect is generated between the first comb tooth groove and a comb tooth, making sliding between the slide plate 400 and the rotary plate 200 more stable. At this time, a damping effect between the second comb tooth groove and the comb tooth is small or even does not exist. When the slide plate 400 slides in a direction away from the rotary shaft 300, a damping effect is generated between the second comb tooth groove and the second comb tooth, making the sliding between the slide plate 400 and the rotary plate 200 more stable. At this time, the damping effect between the first comb tooth groove and the comb tooth is small or even does not exist. It can be seen that with this structure, the slide plate 400 has relatively good stability when sliding in opposite directions.

It should be noted that variation of the cross-sectional area of the trapezoidal groove does not need to be too large. On the one hand, the variation of the cross-sectional area can meet the requirement for generating the damping effect, and on the other hand, no excessively great damping effect that causes the slide plate 400 to be not slide in place will not be generated.

In some embodiments, the slide plate 400 may include a main body portion 420 and multiple spacing bars 430 connected to the main body portion 420. The multiple spacing bars 430 are arranged at intervals, and a comb tooth groove is formed between adjacent spacing bars 430, and the comb teeth may be matched with the spacing bars 430, thereby achieving guide. The spacing bars 430 may include a first spacing section, a second spacing section, and a third spacing section which are arranged in sequence. The first spacing section and the third spacing section are both rigid structures, and the second spacing section is a flexible structure. When the slide plate 400 slides relative to the rotary plate 200, the comb teeth are matched with the first spacing section, the second spacing section, and the third spacing section in sequence. When the comb teeth are matched with the first spacing section and the third spacing section, because the first spacing section and the third spacing section basically do not deform, the slide plate 400 is subject to a great friction force when sliding. When a comb tooth is matched with the second spacing section, because the second spacing section may be compressed and deformed, a friction force born by the comb tooth is relatively small, which makes the slide plate 400 slide more smoothly and has better touch feeling.

To better position the slide plate 400 and the rotary plate 200, the slide plate 400 is further provided with a positioning groove 440, and the rotary plate 200 is further provided with a second positioning flange 220. The positioning groove 440 is located at an edge of the slide plate 400 and communicates with a comb tooth groove, and the positioning groove 440 is matched with the second positioning flange 220 in a positioning manner in a sliding direction of the slide plate 400. That is, when the slide plate 400 rotates relative to the rotary plate 200, once the positioning groove 440 is matched with the second positioning flange 220 in a positioning manner, sliding of the slide plate 400 will be restricted, so that variation of a position of the slide plate 400 relative to the rotary plate 200 will be more accurate, and it can be prevented that a sliding stroke of the slide plate 400 exceeds a reasonable range, resulting in damage of the slide plate 400 or the rotary plate 200.

The electronic device disclosed in the embodiments of the present disclosure may be a smartphone, a tablet computer, an e-book reader, or a wearable device. Certainly, the electronic device may also be another device, which is not limited in the embodiments of the present disclosure.

The embodiments of the present disclosure focus on describing differences between the embodiments, and different optimization features of the embodiments may be combined to form better embodiments provided that they are not contradictory. Considering brevity, details are not described herein again.

The foregoing descriptions are merely embodiments of the present disclosure, but are not intended to limit the present disclosure. Various changes and modifications may be made to the present disclosure by those skilled in the art. Any modifications, equivalent substitutions, improvements, and the like made within the spirit and principle of the present disclosure should be included within the scope of the claims of the present disclosure.

The invention claimed is:

1. An electronic device, comprising:
   a device body;
   a rotary plate hinged to the device body through a rotary shaft and provided with a first guide portion;
   a slide plate slidably connected to the rotary plate and provided with a second guide portion, wherein the second guide portion is slidably matched with the first guide portion; and
   a flexible display screen connected to the device body and the slide plate respectively, wherein the slide plate slides relative to the rotary plate during switching between an unfolded state and a folded state of the flexible display screen,
   wherein the first guide portion comprises multiple comb teeth, and the second guide portion comprises multiple comb teeth grooves, wherein the multiple comb teeth are matched with the multiple comb teeth grooves in a one-to-one correspondence,
   wherein a comb tooth is provided with a first positioning flange, and a comb tooth groove is provided with a step portion, wherein the first positioning flange and the step portion are matched in a positioning manner in a direction perpendicular to the slide plate.

2. The electronic device according to claim 1, wherein the multiple comb teeth comprise a first comb tooth, wherein the first comb tooth is an elastic comb tooth, and one surface, facing the flexible display screen, of the first comb tooth is provided with a first bar-shaped portion and a second bar-shaped portion, wherein both the first bar-shaped portion and the second bar-shaped portion extend along a sliding direction of the slide plate, and a gap exists between the first bar-shaped portion and the second bar-shaped portion.

3. The electronic device according to claim 2, wherein an end side that is of at least one of the first bar-shaped part and the second bar-shaped part and that faces the flexible display screen is provided with an extension flange, wherein the extension flange is matched with a side wall of a comb tooth groove.

4. The electronic device according to claim 2, wherein the multiple comb teeth comprise a second comb tooth, and a surface, facing the flexible display screen, of the second comb tooth is a smooth surface, and the first comb tooth and the second comb tooth are matched with different comb teeth grooves respectively.

5. The electronic device according to claim 1,
   wherein:
   at least one comb tooth groove is a trapezoidal groove,
   a cross-sectional area of the trapezoidal groove gradually increases in a direction toward the rotary shaft, and
   the cross section is perpendicular to a sliding direction of the slide plate.

6. The electronic device according to claim 5, wherein the multiple comb teeth grooves comprise a first comb tooth groove and a second comb tooth groove, wherein the first comb tooth groove and the second comb tooth groove are alternately arranged, and in a direction toward the rotary shaft, a cross-sectional area of the first comb tooth groove gradually increases and a cross-sectional area of the second comb tooth groove gradually decreases.

7. The electronic device according to claim 1, wherein the slide plate comprises a main body portion and multiple spacing bars connected to the main body portion,
   wherein:
   the multiple spacing bars are arranged at intervals,
   a comb tooth groove is formed between adjacent spacing bars, and
   a spacing bar comprises a first spacing section, a second spacing section, and a third spacing section arranged in sequence, wherein the first spacing section and the third spacing section are rigid structures, and the second spacing section is a flexible structure.

8. The electronic device according to claim 1,
   wherein:
   the slide plate is further provided with a positioning groove,
   the rotary plate is further provided with a second positioning flange,
   the positioning groove is located at an edge of the slide plate and communicates with a comb tooth groove, and
   the positioning groove is matched with the second positioning flange in a positioning manner in a sliding direction of the slide plate.

* * * * *